(12) United States Patent
Lee

(10) Patent No.: US 8,456,925 B2
(45) Date of Patent: Jun. 4, 2013

(54) NON-VOLATILE MEMORY DEVICE AND METHOD FOR OPERATING THE SAME

(75) Inventor: Jung-Hwan Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 175 days.

(21) Appl. No.: 12/975,981

(22) Filed: Dec. 22, 2010

(65) Prior Publication Data

US 2011/0292744 A1 Dec. 1, 2011

(30) Foreign Application Priority Data

May 28, 2010 (KR) .................. 10-2010-0050293

(51) Int. Cl.
*G11C 11/34* (2006.01)
(52) U.S. Cl.
USPC ............................. 365/189.05; 365/189.17
(58) Field of Classification Search
USPC ....................................... 365/189.05, 189.17
See application file for complete search history.

(56) References Cited

U.S. PATENT DOCUMENTS 5,930,172 A * 7/1999 Kucera ..................... 365/185.21
8,059,484 B2 * 11/2011 Yoko .......................... 365/233.1

FOREIGN PATENT DOCUMENTS

KR 1020070031585 3/2007

OTHER PUBLICATIONS

Notice of Allowance issued from Korean Intellectual Property Office on Nov. 21, 2011.

\* cited by examiner

*Primary Examiner* — Son Dinh
*Assistant Examiner* — Nam Nguyen
(74) *Attorney, Agent, or Firm* — IP & T Group LLP

(57) ABSTRACT

A non-volatile memory device includes a plurality of input pads, a buffer configured to buffer data inputted through the plurality of the input pads in synchronization with a write enable signal, an even latch configured to store a first buffered data outputted from the buffer in response to an even write enable signal, an odd latch configured to store a second buffered data outputted from the buffer in response to an odd write enable signal, and a transfer unit configured to transfer stored data in the even latch and the odd latch to a selected bank of a plane in response to a bank selection signal.

8 Claims, 5 Drawing Sheets

NON-VOLATILE MEMORY DEVICE AND METHOD FOR OPERATING THE SAME

CROSS-REFERENCE TO RELATED APPLICATIONS

The present application claims priority of Korean Patent Application No. 10-2010-0050293, filed on May 28, 2010, which is incorporated herein by reference in its entirety.

BACKGROUND OF THE INVENTION

Exemplary embodiments of the present invention relate to an input/output unit of a non-volatile memory device and a method for operating the same.

Memory devices are divided into a volatile memory device and a non-volatile memory device according to whether data are sustained when a power source is cut off. The volatile memory device loses data when a power source is cut off, and Dynamic Random Access Memory (DRAM) and Synchronous DRAM (SDRAM) belong to the category of volatile memory device. The non-volatile memory device sustains data although a power source is cut off, and flash memory device belongs to the category of non-volatile memory device.

FIG. 1 illustrates data inputted into input/output pads in a conventional non-volatile memory device.

Referring to FIG. 1, a write enable signal WE# toggles in a duration when data are inputted to input/output pads IO×8, and data are inputted in synchronization with a rising edge of the toggling write enable signal WE#.

In a conventional non-volatile memory device, one period tWC of the write enable signal WE# may be approximately 25 nm (which is approximately 40 MHz in frequency), and the non-volatile memory device generally includes 8 input/output pads IO×8. Therefore, the data may be inputted to the non-volatile memory device at a rate of approximately 40 MB/s.

Meanwhile, when the data are outputted from the non-volatile memory device through the input/output pads IO×8, the data are outputted in synchronization with a read enable signal RE#. The output of the data through the input/output pads IO×8 is performed basically the same as the input of the data therethrough except that the signal with which the data are synchronized is not the write enable signal WE# but the read enable signal RE#.

FIG. 2 illustrates a data input/write path in a conventional non-volatile memory device.

Referring to FIG. 2, a write path of the conventional non-volatile memory device includes a buffer 210, a latch 220, and first to third demultiplexers (DEMUX) 230, 240 and 250.

The data inputted into 8 input/output pads 200 are buffered by the buffer 210 operating in synchronization with the write enable signal WE#. Since the number of the input/output pads 200 is 8, the number of the output lines of the buffer 210 is 8, too.

The latch 220 latches the data obtained from the buffering in the buffer 210 in synchronization with the write enable signal WE#. The latch 220 has 8 output lines IDIN<0:7> as well.

The first demultiplexer 230 outputs the output of the latch 220 to the second demultiplexer 240 or the third demultiplexer 250 in response to a bank selection signal BANK_SEL. There are 16 lines GDL_B0<0:15> and GDL_B1<0:15> between the demultiplexer 230 and the demultiplexer 240 and between the demultiplexer 230 and the demultiplexer 250, respectively, and a low/high selection signal L/H_SEL determines to which line the output of the latch 220 is to be transferred among the 16 lines. The following Table shows where an output signal of the latch 220 is transferred based on the level of the low/high selection signal L/H_SEL and the bank selection signal BANK_SEL.

TABLE 1

| BANK_SEL | L/H_SEL | Line to receive |
| --- | --- | --- |
| H | H | GDL_B1<8:15> |
| H | L | GDL_B1<0:7> |
| L | H | GDL_B0<8:15> |
| L | L | GDL_B0<0:7> |

The second demultiplexer 240 transfers the output of the first demultiplexer 230 on lines GDL_B0<0:15> to a bank 0 of a plane 0 and a bank 0 of a plane 1. Then, the data is stored in a bank 0 of an enabled plane between the plane 0 and the plane 1.

The third demultiplexer 250 transfers the output of the first demultiplexer 230 on lines GDL_B1<0:15> to a bank 1 of a plane 0 and a bank 1 of a plane 1. Then, the data is stored in a bank 1 of an enabled plane between the plane 0 and the plane 1.

FIG. 3 illustrates a data output/read path in the conventional non-volatile memory device.

Referring to FIG. 3, a read path of the conventional non-volatile memory device includes first and second multiplexers 310 and 320 and an output unit 330.

The first multiplexer 310 transfers data which are outputted form a core region and loaded on lines GDL_B0_P0<0:15>, GDL_B1_P0<0:15>, GDL_B1_P1<0:15>, and GDL_B0_P1<0:15> outputted to 32 lines GDL_B0<0:15> and GDL_B1<0:15> in response to a plane selection signal PLANE_SEL. When a plane 0 is selected based on the plane selection signal PLANE_SEL, the data on lines GDL_B0_P0<0:15> is transferred to the line GDL_B0<0:15>, and the data on lines GDL_B1_P0<0:15> is transferred to the line GDL_B1<0:15>. Also, when a plane 1 is selected based on the plane selection signal PLANE_SEL, the data on lines GDL_B0_P1<0:15> is transferred to the line GDL_B0<0:15>, and the data on lines GDL_B1_P1<0:15> is transferred to the line GDL_B1<0:15>.

The second multiplexer 320 selects a group of signals between the output signals of the first multiplexer 310 in response to a bank selection signal BANK_SEL and outputs the selected output signal to its output terminal IDOUT<0:7>. The output lines GDL_B0<0:15> and GDL_B1<0:15> of the first multiplexer 310 includes 16 lines, respectively. Which line of the signal is to be transferred to the output terminal IDOUT<0:7> of the second multiplexer 320 is determined based on the low/high selection signal L/H_SEL. The following Table 2 shows which lines are to be selected based on the level of the low/high selection signal L/H_SEL and the bank selection signal BANK_SEL.

TABLE 2

| BANK_SEL | L/H_SEL | Line to be selected |
| --- | --- | --- |
| H | H | GDL_B1<8:15> |
| H | L | GDL_B1<0:7> |
| L | H | GDL_B0<8:15> |
| L | L | GDL_B0<0:7> |

The output unit 330 outputs the output data of the second multiplexer 320 to an input/output pad 340 in synchronization with the read enable signal RE#.

Although one bank includes 16 IOs in the non-volatile memory device, it may include 8 input/output pads. Therefore, to input/output data to/from one bank, the data is inputted/outputted over two cycles through the input/output pads. This method, however, consumes relatively significant time to input/output the data in the non-volatile memory device. If the number of the input/output pads is increased to 16, this concern may be addressed, but increasing the number of the input/output pads leads to an increase in the corresponding area inside a chip.

SUMMARY OF THE INVENTION

An exemplary embodiment of the present invention is directed to a non-volatile memory device which inputs/outputs a data at a high speed while not increasing the number of input/output pads.

In accordance with an exemplary embodiment of the present invention, a non-volatile memory device includes: a plurality of input pads; a buffer configured to buffer data inputted through the plurality of the input pads in synchronization with a write enable signal; an even latch configured to store a first buffered data outputted from the buffer in response to an even write enable signal; an odd latch configured to store a second buffered data outputted from the buffer in response to an odd write enable signal; and a transfer unit configured to transfer stored data in the even latch and the odd latch to a selected bank of a plane in response to a bank selection signal.

In accordance with another exemplary embodiment of the present invention, a non-volatile memory device includes: a core region configured to store data; a selector configured to output data stored in core region from a selected bank of a selected plane in response to a plane selection signal and a bank selection signal; a transfer unit configured to transfer a half of output data of the selector in response to an even read enable signal, and transfer the other half of the output data of the selector in response to an odd read enable signal; and an output unit configured to output data transferred from the transfer unit to a plurality of output pads.

In accordance with yet another exemplary embodiment of the present invention, a method for operating a non-volatile memory device includes: receiving data in synchronization with a write enable signal; storing a first received data in response to an even write enable signal; storing a second received data in response to an odd write enable signal; and transferring stored data to a selected bank of a plane in response to a bank selection signal.

In accordance with yet another exemplary embodiment of the present invention, a method for operating a non-volatile memory device includes: outputting data of a selected bank of a selected plane from a core region in response to a plane selection signal and a bank selection signal; transferring a half of outputted data in response to an even read enable signal, and transferring the other half of the outputted data in response to an odd read enable signal; and outputting transferred data to a plurality of output pads.

DESCRIPTION OF SPECIFIC EMBODIMENTS

Figure 1:
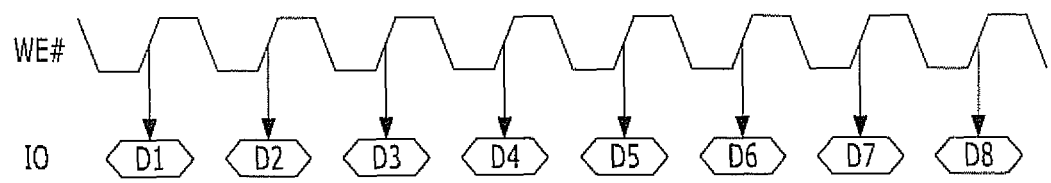
FIG. 1 illustrates data inputted into input/output pads in a conventional non-volatile memory device.
Figure 2:
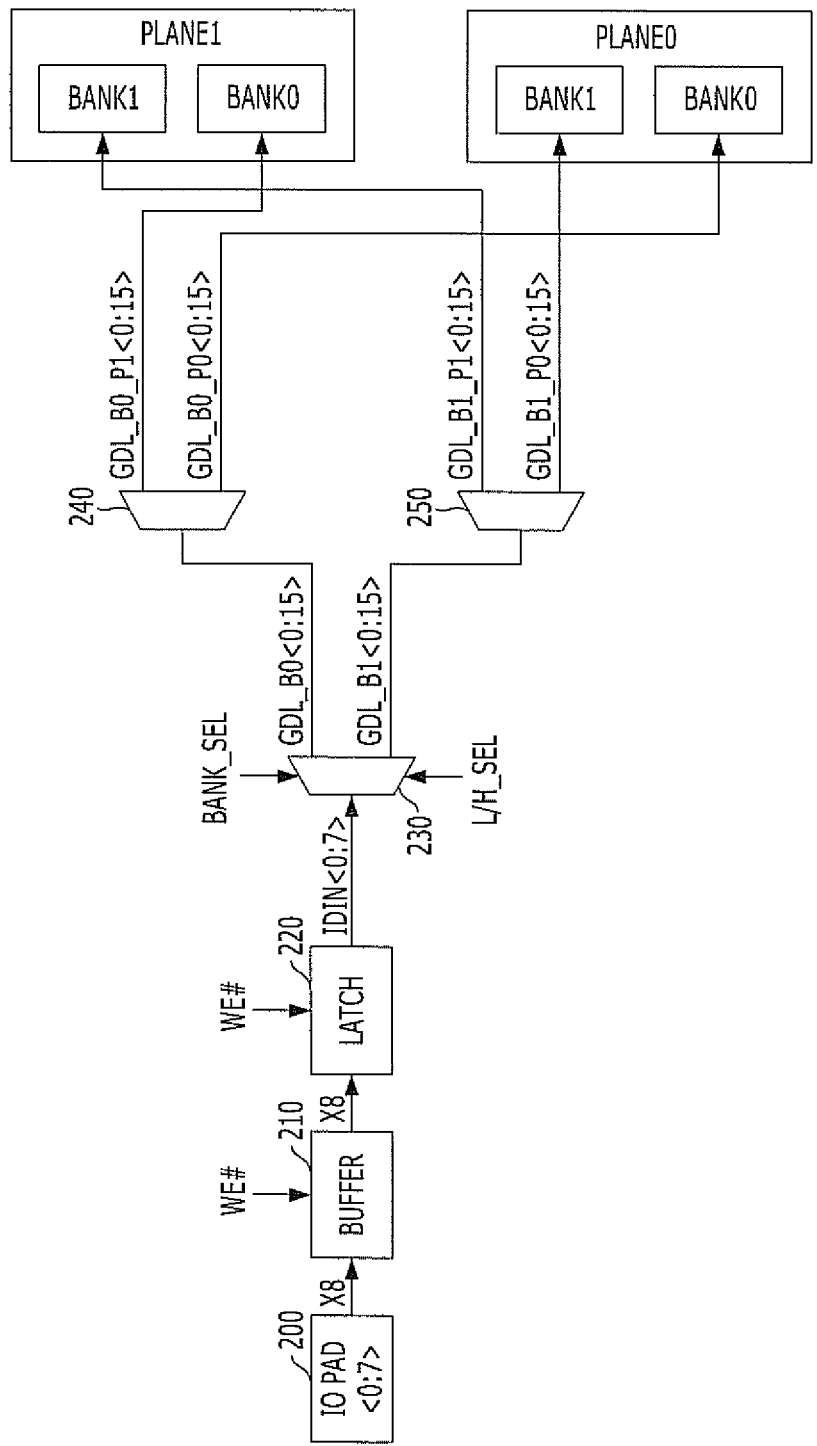
FIG. 2 illustrates a data input path in the conventional non-volatile memory device.
Figure 3:
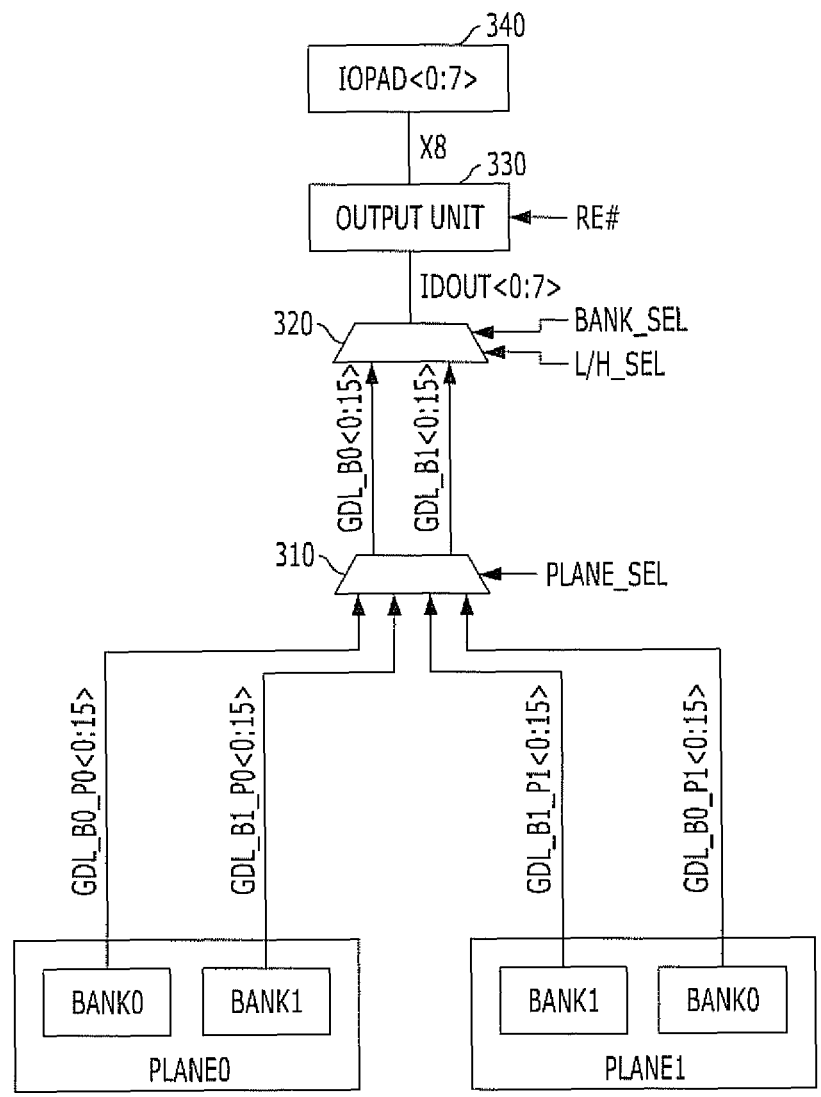
FIG. 3 illustrates a data output path in the conventional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 4:
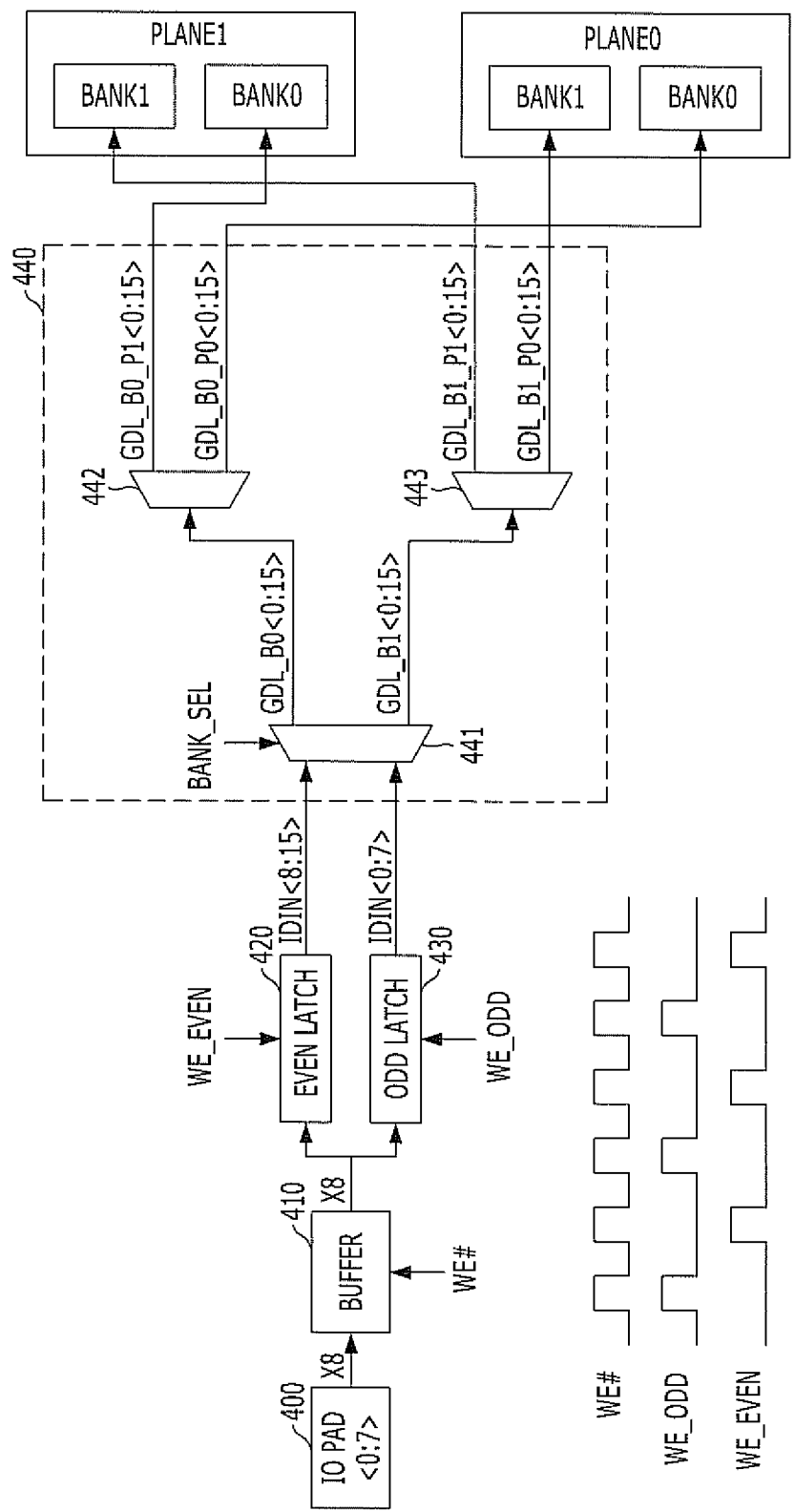
FIG. 4 illustrates a data input path in a non-volatile memory device in accordance with an embodiment of the present invention.

FIG. 4 illustrates a data input path in a non-volatile memory device in accordance with an embodiment of the present invention.

Referring to FIG. 4, a non-volatile memory device includes a plurality of input pads 400, a buffer 410, an even latch 420, an odd latch 430, and a transfer unit 440. The buffer 410 receives data that are inputted to the plurality of the input pads 400 in synchronization with a write enable signal WE#. The even latch 420 stores the data obtained from the buffering in the buffer 410 in response to an even write enable signal WE_EVEN. The odd latch 430 stores the data obtained from the buffering in the buffer 410 in response to an odd write enable signal WE_ODD. The transfer unit 440 transfers the data stored in the even latch 420 and the odd latch 430 to a selected bank of a plane in response to a bank selection signal BANK_SEL.

The buffer 410 buffers the data inputted to 8 input pads 400 in synchronization with the write enable signal WE#. The buffer 410 may include 8 input buffers, and 8 output lines thereof. In the embodiment of the present invention, the non-volatile memory device may operate stably although the frequency of the write enable signal WE# is doubled compared with conventional technology. For example, when the write enable signal WE# is approximately 40 MHz according to the conventional technology, the non-volatile memory device fabricated according to the embodiment of the present invention may stably operate even if the write enable signal WE# is approximately 80 MHz.

The even latch 420 stores the data obtained from the buffering in the buffer 410 in response to the even write enable signal WE_EVEN. The even write enable signal WE_EVEN is a signal that is enabled in an even-numbered enable duration (e.g., pulse) of the write enable signal WE#. Referring to the bottom part of FIG. 4, the relationship between the even write enable signal WE_EVEN and the write enable signal WE# may be clearly understood. Since the even latch 420 operates in synchronization with the even write enable signal WE_EVEN, the even latch 420 stores data that are transferred in the order of even numbers among the data loaded on an output line of the buffer 410.

The odd latch 430 stores the data obtained from the buffering in the buffer 410 in response to the odd write enable signal WE_ODD. The odd write enable signal WE_ODD is a signal that is enabled in an odd-numbered enable duration of the write enable signal WE#. Referring to the bottom part of FIG. 4, the relationship between the odd write enable signal WE_ODD, the even write enable signal WE_EVEN and the write enable signal WE# may be clearly understood. Since the odd latch 430 operates in synchronization with the odd write enable signal WE_ODD, the odd latch 430 stores data that are transferred in the order of odd numbers among the data loaded on an output line of the buffer 410.

The transfer unit 440 transfers the data IDIN<8:15> stored in the even latch 420 and the data IDIN<0:7> stored in the odd latch 430 to the selected bank of the plane in response to the bank selection signal BANK_SEL. The transfer unit 440 may include first to third demultiplexers 441, 442, and 443.

The first demultiplexer 441 outputs the data IDIN<0:15> stored in the even latch 420 and the odd latch 430 as a first bank data GDL_B0<0:15> or a second bank data GDL_B1<0:15> in response to the bank selection signal BANK_SEL. When a first bank is selected based on the bank selection signal BANK_SEL, the data IDIN<0:15> is output as the first bank data GDL_B0<0:15>, and when a second bank is selected based on the bank selection signal BANK_SEL, the data IDIN<0:15> is output as the second bank data GDL_B1<0:15>. Since 16 data IDIN<0:15> are already latched in the even latch 420 and the odd latch 430, the first demultiplexer 441 outputs the 16 data IDIN<0:15> as the first bank data GDL_B0<0:15> or the second bank data GDL_B1<0:15> at one operation.

The second demultiplexer 442 transfers the first bank data GDL_B0<0:15> to a first bank BANK0 of a first plane PLANE0 and a first bank BANK0 of a second plane PLANE1. Although the first bank data GDL_B0<0:15> are transferred to both of the first plane PLANE0 and the second plane PLANE1, the first bank data GDL_B0<0:15> are stored in the first bank BANK0 of an enabled plane since only one plane between the first plane PLANE0 and the second plane PLANE1 is enabled.

The third demultiplexer 443 transfers the second bank data GDL_B1<0:15> to a second bank BANK1 of the first plane PLANE0 and a second bank BANK1 of the second plane PLANE1. Although the second bank data GDL_B1<0:15> are transferred to both of the first plane PLANE0 and the second plane PLANE1, the second bank data GDLB1<0:15> are stored in the second bank BANK1 of an enabled plane since only one plane between the first plane PLANE0 and the second plane PLANE1 is enabled.

According to the embodiment of the present invention, the even data IDIN<8:15> and the odd data IDIN<0:7> are separately latched based on the even write enable signal WE_EVEN and the odd write enable signal WE_ODD, and in the inside, the even data IDIN<8:15> and the odd data IDIN<0:7> are simultaneously transferred. Therefore, although the frequency of the write enable signal WE# becomes greater than that of the conventional technology, stable operation may be secured. In short, although 8 input pads 400 are used, the data may be received as fast as received through 16 input pads 400.

Figure 5:
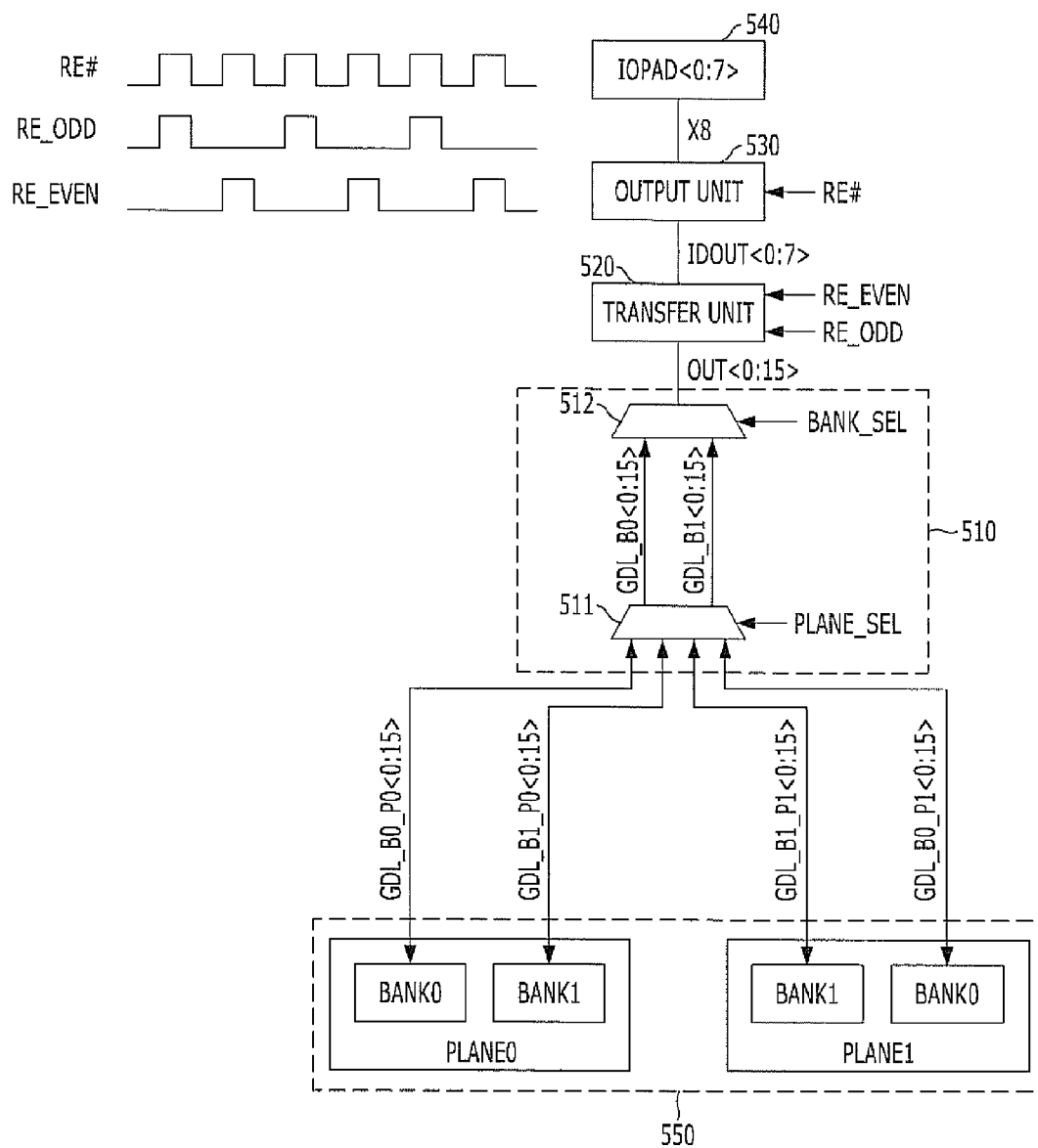
FIG. 5 illustrates a data output path in the non-volatile memory device in accordance with the embodiment of the present invention.

FIG. 5 illustrates a data output path in the non-volatile memory device in accordance with the embodiment of the present invention.

Referring to FIG. 5, the non-volatile memory device includes a core region 550, a selector 510, a transfer unit 520, and an output unit 530. The core region 550 stores data. The selector 510 outputs data of a selected bank in a selected plane from the core region 550 in response to a plane selection signal PLANE_SEL and a bank selection signal BANK_SEL. The transfer unit 520 transfers a half OUT<0:7> of an output data OUT<0:15> of the selector 510 in response to an even read enable signal RE_EVEN, and transfers the other half OUT<8:15> of the output data OUT<0:15> of the selector 510 in response to an odd read enable signal RE_ODD. The output unit 530 outputs data IDOUT<0:7> transferred from the transfer unit 520 to a plurality of output pads 540.

The selector 510 outputs data of a selected bank in a selected plane in response to the plane selection signal PLANE_SEL and the bank selection signal BANK_SEL. The selector 510 may be formed to include a first multiplexer 511 and a second multiplexer 512.

The first multiplexer 511 selects the data of a plane selected based on the plane selection signal PLANE_SEL, and outputs the selected data as its output signals GDL_B0<0:15> and GDL_B1<0:15>. When the first plane PLANE0 is selected based on the plane selection signal PLANE_SEL, data GDL_B0_P0<0:15> and GDL_B1_P0<0:15> is output as the output signals GDL_B0<0:15> and GDL_B1<0:15>, respectively. When the second plane PLANE1 is selected based on the plane selection signal PLANE_SEL, data GDL_B0_P1<0:15> and GDL_B1_P1<0:15> is output as the output signals GDL_B0<0:15> and GDL_B1<0:15>, respectively.

The second multiplexer 512 selects its output signal in response to the bank selection signal BANK_SEL. When the first bank BANK0 is selected based on the bank selection signal BANK_SEL, the output signals GDL_B0<0:15> are output as the output data OUT<0:15>, and when the second bank BANK1 is selected based on the bank selection signal BANK_SEL, the output signals GDL_B1<0:15> are output as the output data OUT<0:15>.

The transfer unit 520 transfers the half OUT<0:7> of the output data OUT<0:15> of the selector 510 to output lines, i.e., as the data IDOUT<0:7>, in response to the even read enable signal RE_EVEN, and transfers the other half OUT<8:15> of the output data OUT<0:15> of the selector 510 to the output lines, i.e., as the data IDOUT<0:7>, in response to the odd read enable signal RE_ODD. The even read enable signal RE_EVEN is a signal that is enabled in an even-numbered enable duration of the read enable signal RE#, and the odd read enable signal RE_ODD is a signal that is enabled in an odd-numbered enable duration of the read enable signal RE#. Referring to FIG. 5, the relationship between the odd read enable signal RE_ODD, the even read enable signal RE_EVEN and the read enable signal RE# may be clearly understood.

The output unit 530 outputs the data IDOUT<0:7> transferred from the transfer unit 520 to the 8 output pads 540 in synchronization with the read enable signal RE#. The output unit 530 may include 8 output drivers.

According to an embodiment of the present invention, which is described above, when a data is inputted, an even data and an odd data are latched and transferred separately based on an even write enable signal and an odd write enable signal. Therefore, the data may be latched and transferred stably. As a result, the stability of the input data may be secured even at a higher clock frequency.

Also, the technology of the present invention may secure the stability of data when the data are outputted at a high speed.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
   a plurality of input pads;
   a buffer configured to buffer data inputted through the plurality of the input pads in synchronization with a write enable signal;
   an even latch configured to store a first buffered data outputted from the buffer in response to an even write enable signal;
   an odd latch configured to store a second buffered data outputted from the buffer in response to an odd write enable signal;
   a transfer unit configured to transfer stored data in the even latch and the odd latch to a selected bank of a plane in response to a bank selection signal,
   wherein the transfer unit comprises:
      a first demultiplexer configured to output the stored data in the even latch and the odd latch as a first bank data or a second bank data in response to the bank selection signal;
      a second demultiplexer configured to output the first bank data to a first bank of a first plane and a first bank of a second plane; and
      a third demultiplexer configured to output the second bank data to a second bank of the first plane and a second bank of the second plane.

2. The non-volatile memory device of claim 1, wherein the even write enable signal is a signal corresponding to an even-numbered pulse of the write enable signal, and the odd write enable signal is a signal corresponding to an odd-numbered pulse of the write enable signal.

3. The non-volatile memory device of claim 1, wherein the first bank data is stored in the first bank of an activated plane between the first plane and the second plane, and the second bank data is stored in the second bank of an activated plane between the first plane and the second plane.

4. The non-volatile memory device of claim 1, wherein the even and odd latches separately store the first and second buffered data to be transferred by the transfer unit at the same time.

5. The non-volatile memory device of claim 1, further comprising:
   a core region configured to store data transferred from the transfer unit;
   a selector configured to output data stored in the core region in response to a plane selection signal and the bank selection signal;
   an output transfer unit configured to transfer a half of output data of the selector in response to an even read enable signal and transfer the other half of the output data of the selector in response to an odd read enable signal; and
   an output unit configured to output data transferred from the output transfer unit to a plurality of output pads.

6. A method for operating a non-volatile memory device, comprising:
   receiving data in synchronization with a write enable signal;
   storing a first received data in response to an even write enable signal;
   storing a second received data in response to an odd write enable signal; and
   transferring stored data to a selected bank of a plane in response to a bank selection signal,
   wherein the transferring of stored data comprises:
      outputting the stored data as a first bank data or a second bank data in response to the bank selection signal;
      outputting the first bank data to a first bank of a first plane and a first bank of a second plane; and
      outputting the second bank data to a second bank of the first plane and a second bank of the second plane.

7. The method of claim 6, wherein the even write enable signal is a signal corresponding to an even-numbered pulse of the write enable signal, and the odd write enable signal is a signal corresponding to an odd-numbered pulse of the write enable signal.

8. The method of claim 6, wherein the first bank data is stored in the first bank of an activated plane between the first plane the second plane, and the second bank data is stored in the second bank of an activated plane among the first plane and the second plane.

* * * * *